(12) United States Patent
Chang et al.

(10) Patent No.: US 8,497,177 B1
(45) Date of Patent: Jul. 30, 2013

(54) METHOD OF MAKING A FINFET DEVICE

(71) Applicant: Taiwan Semiconductor Manufacturing Company, Ltd., Hsin-Chu (TW)

(72) Inventors: Huicheng Chang, Tainan (TW); Jeff J. Xu, Jhubei (TW); Hung-Ta Lin, Hsinchu (TW); Chun-Feng Nieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/645,305

(22) Filed: Oct. 4, 2012

(51) Int. Cl.
*H01L 21/336* (2006.01)

(52) U.S. Cl.
USPC .......................................................... 438/283

(58) Field of Classification Search
USPC .......................................................... 438/283
See application file for complete search history.

(56) References Cited

U.S. PATENT DOCUMENTS

| | | |
|---|---|---|
| 2011/0223735 A1* | 9/2011 | Yu et al. ......................... 438/299 |
| 2012/0319211 A1* | 12/2012 | van Dal et al. ................. 257/401 |
| 2013/0023092 A1* | 1/2013 | Oda et al. ....................... 438/157 |

* cited by examiner

*Primary Examiner* — Bradley K Smith
(74) *Attorney, Agent, or Firm* — Haynes and Boone, LLP

(57) ABSTRACT

A method for fabricating a fin field-effect transistor (FinFET) device includes providing a substrate having a first fin at a first location, and epitaxially growing a second fin on the substrate at the first location. The epitaxial growth is performed at a first temperature. The method further includes performing a thermal annealing at a second temperature in oxygen ambient on the substrate with the second fin thereon to grow an interface wrapping over the second fin. The second temperature is higher than the first temperature.

20 Claims, 9 Drawing Sheets

METHOD OF MAKING A FINFET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, to form a conformal silicon germanium (SiGe) layer with a higher Ge concentration on a SiGe fin raise challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
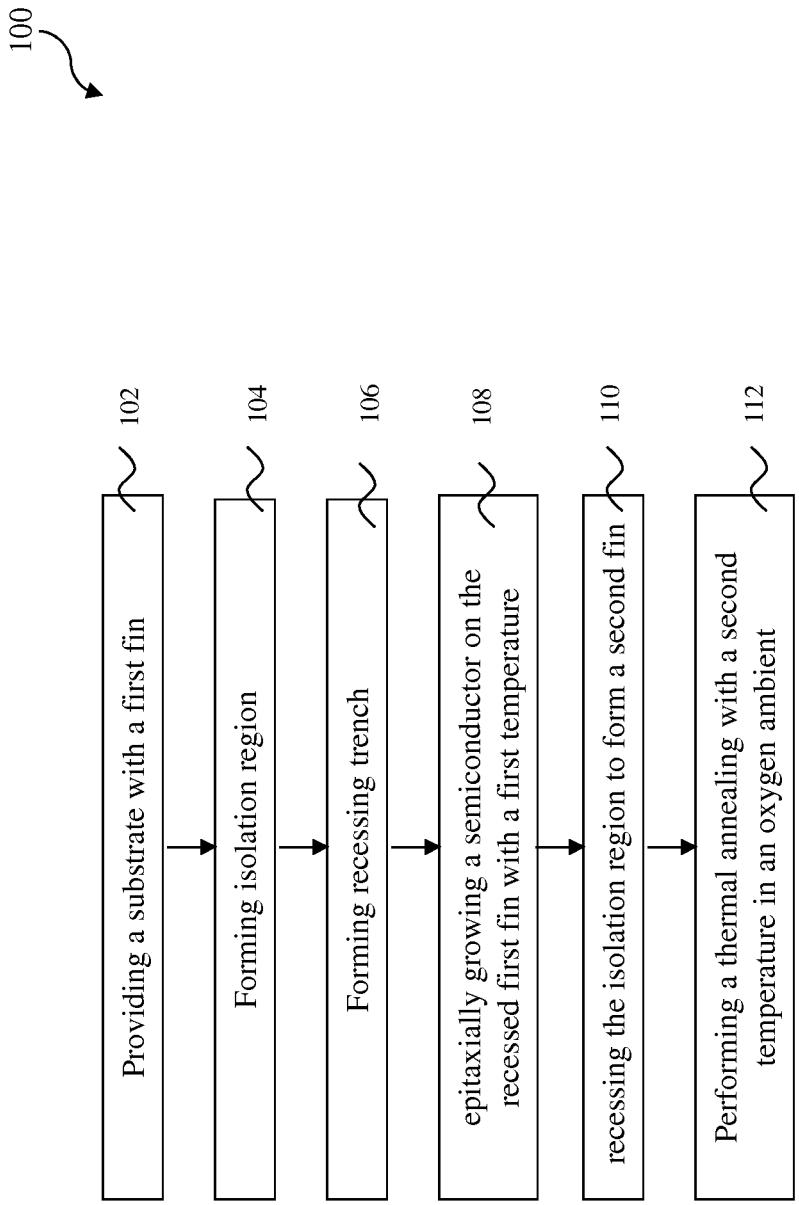
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 according to aspects of the present disclosure. FIGS. 2 through 9 are cross-sectional views of the FinFET device 200 at fabrication stages constructed according to the method 100 of FIG. 1. The method 100 and the FinFET device 200 are collectively described with reference to FIG. 1 through FIG. 9. It is understood that additional steps can be provided before, during, and after the method 100, and some of the steps described can be replaced or eliminated for other embodiments of the method.

Figure 2:
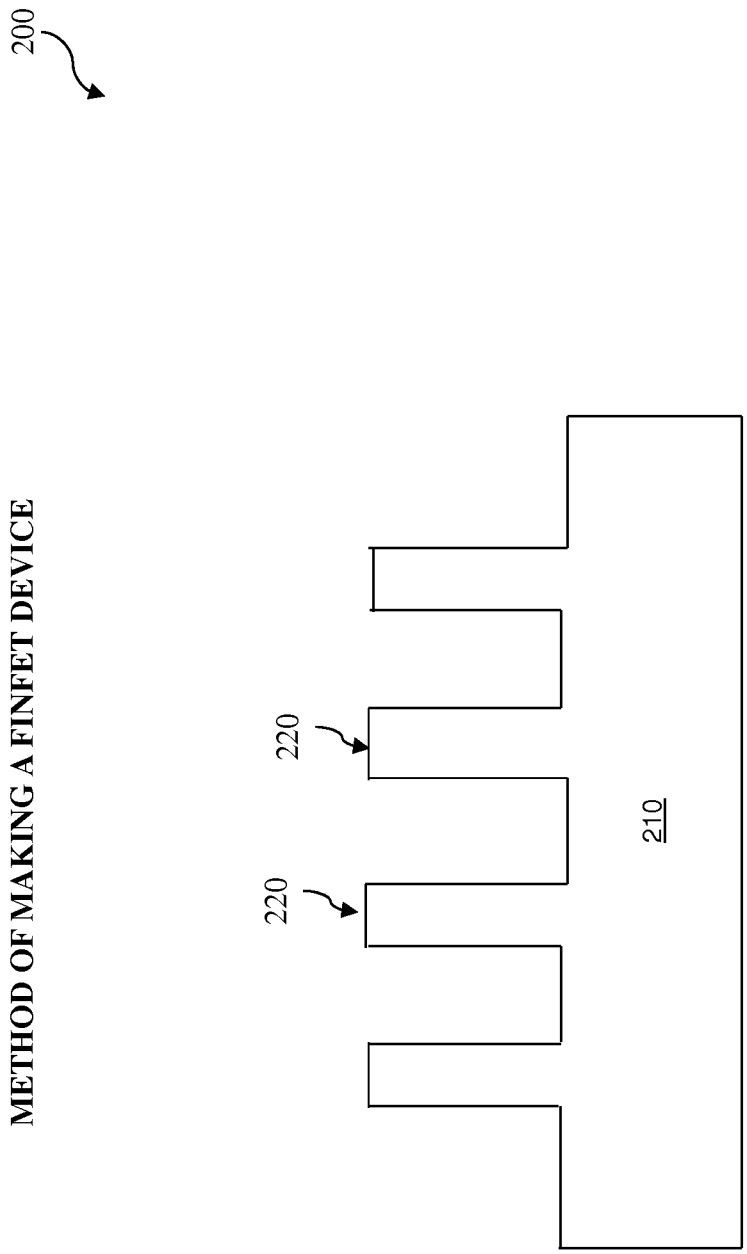
FIGS. 2 to 9 are cross-sectional views of an example FinFET device at fabrication stages constructed according to the method of FIG. 1.

The method 100 begins at step 102 by providing a substrate 210, as shown in FIG. 2. The substrate 210 may be a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A first fin 220 is formed on the substrate 210. In some embodiments, the substrate 210 includes more than one first fin 220. The first fin 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the first fin 220 is formed by patterning and etching a portion of the silicon substrate 210. In another example, the first fin 220 is formed by patterning and etching a silicon layer deposited overlying an insulator layer (for example, an upper silicon layer of a silicon-insulator-silicon stack of an SOI substrate).

As an alternative to traditional photolithography, the first fin 220 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel first fins 220 may be formed in a similar manner.

Figure 3:
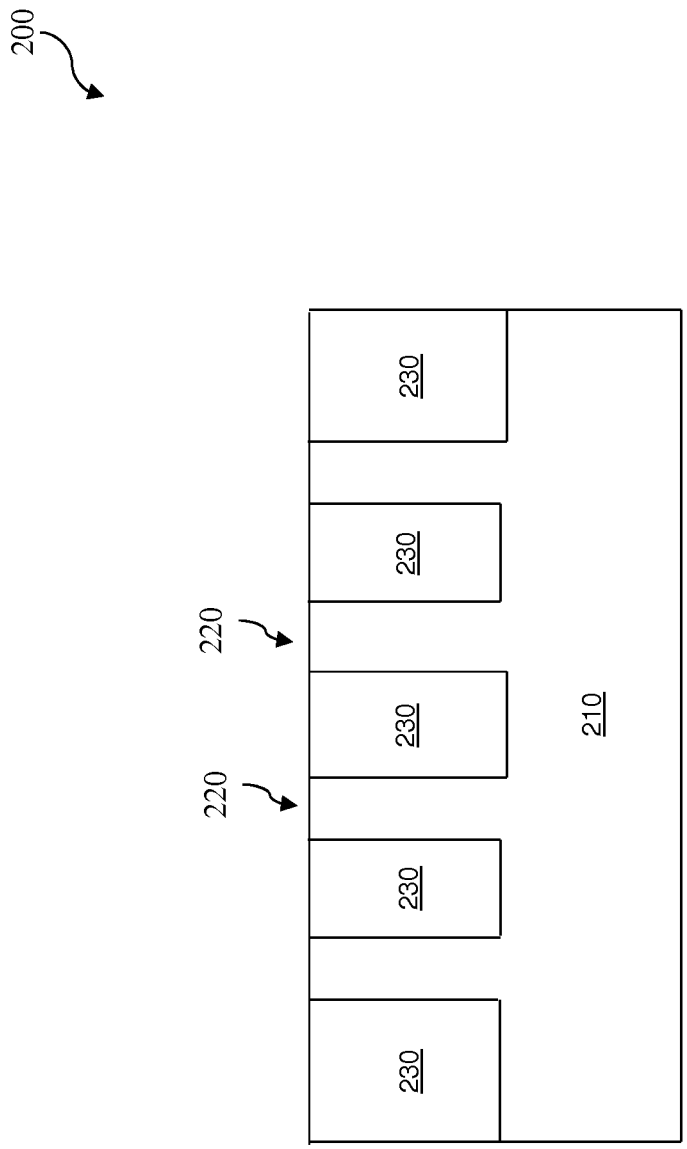

The method 100 proceeds to step 104 by forming isolation regions 230 on the substrate 210 to isolate active regions of the substrate 210, as shown in FIG. 3. For example, the isolation regions 230 separate first fins 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide. In one embodiment, a chemical mechanical polishing (CMP) process is performed to remove excessive dielectric materials and planarize the top surface of the isolation regions 230 with the top surface of the first fin 220, as shown in FIG. 3.

Figure 4:
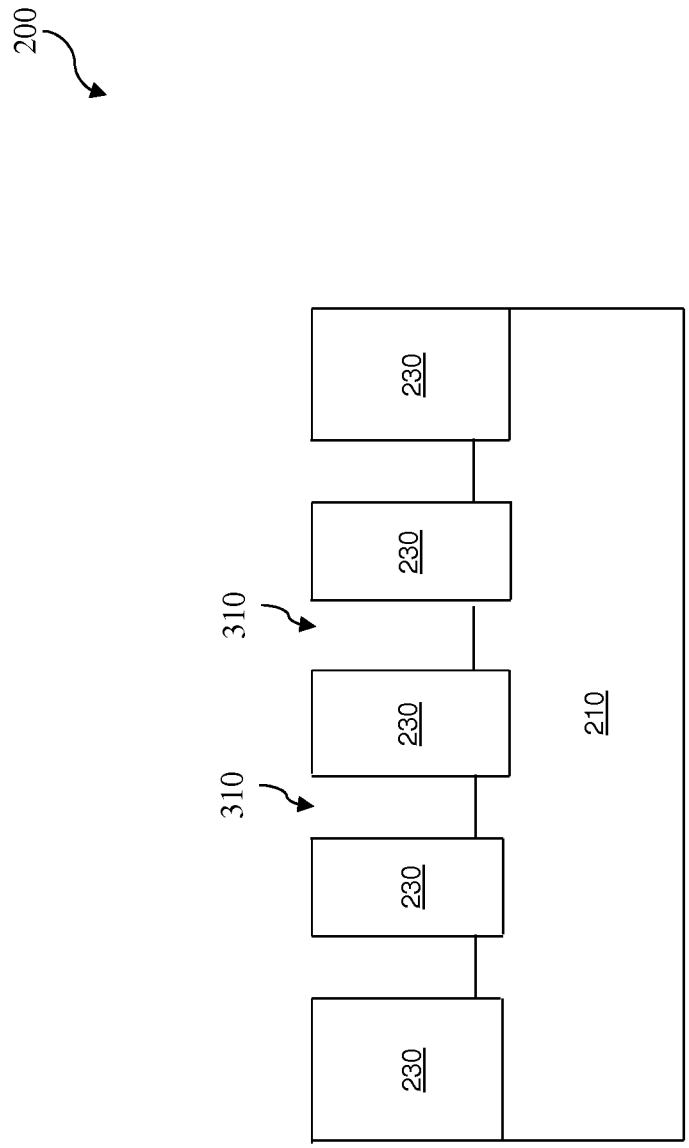

The method 100 proceeds to step 106 by recessing the first fins 220 to form recessing trenches 310 with the isolation region 230 as its sidewalls, as shown in FIG. 4. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5:
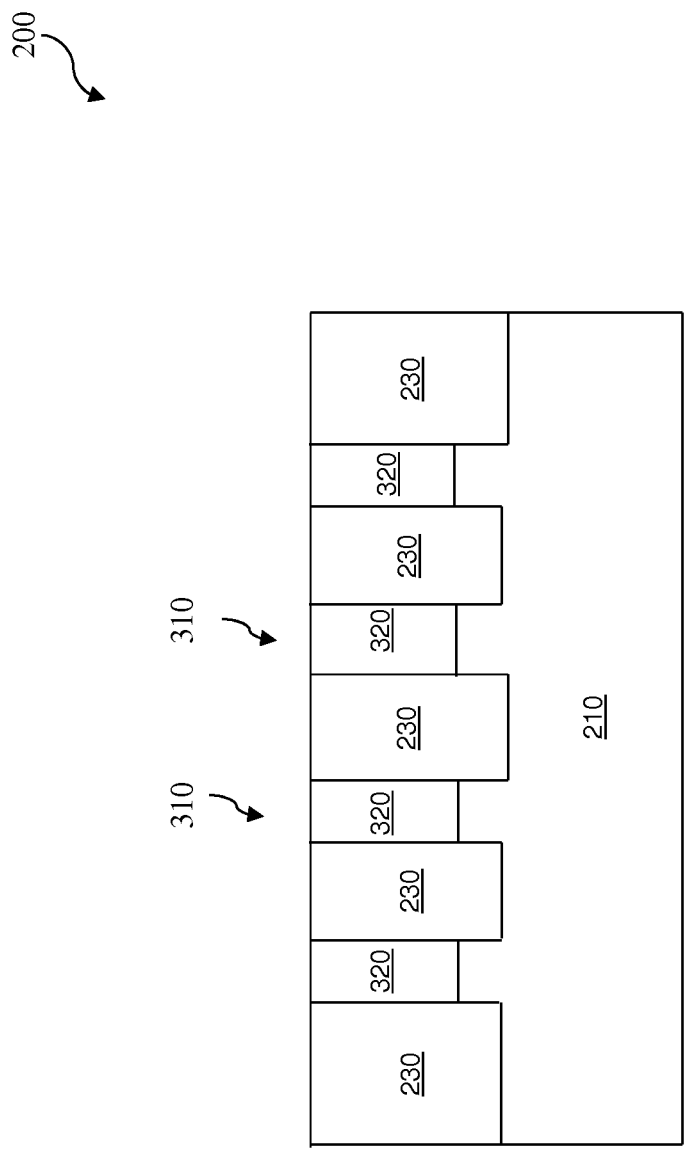

The method 100 proceeds to step 108 by epitaxially growing, at a first temperature less than about 700° C., a semiconductor material layer 320 on top of the recessed first fin 220 and filling in the recessing trench 310, as shown in FIG. 5. The semiconductor material layer 320 is formed of a material of single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes.

In the present embodiment, the epitaxially grown semiconductor material layer 320 includes a material of $Si_{1-x}Ge_x$, where x represents Ge composition in atomic percent. The composition ratio of Ge in the SiGe layer 320 can be controlled by epitaxial growing process conditions, such as pressure, gas flow and the first temperature. In the present embodiment, x is less than or equal to 1, and greater than or equal to 0. The $Si_{1-x}Ge_x$ layer 320 may have an uniform Ge composition (x) across the $Si_{1-x}Ge_x$ layer 320 or a graded Ge composition, which increasing from a bottom surface to a top surface of the $Si_{1-x}Ge_x$ layer 320 with x as its highest composition in atomic percent. Additionally, a CMP process may be performed to remove excessive semiconductor material layer 320 and planarize top surfaces of the semiconductor material layer 320 and the isolation region 230.

Figure 6:
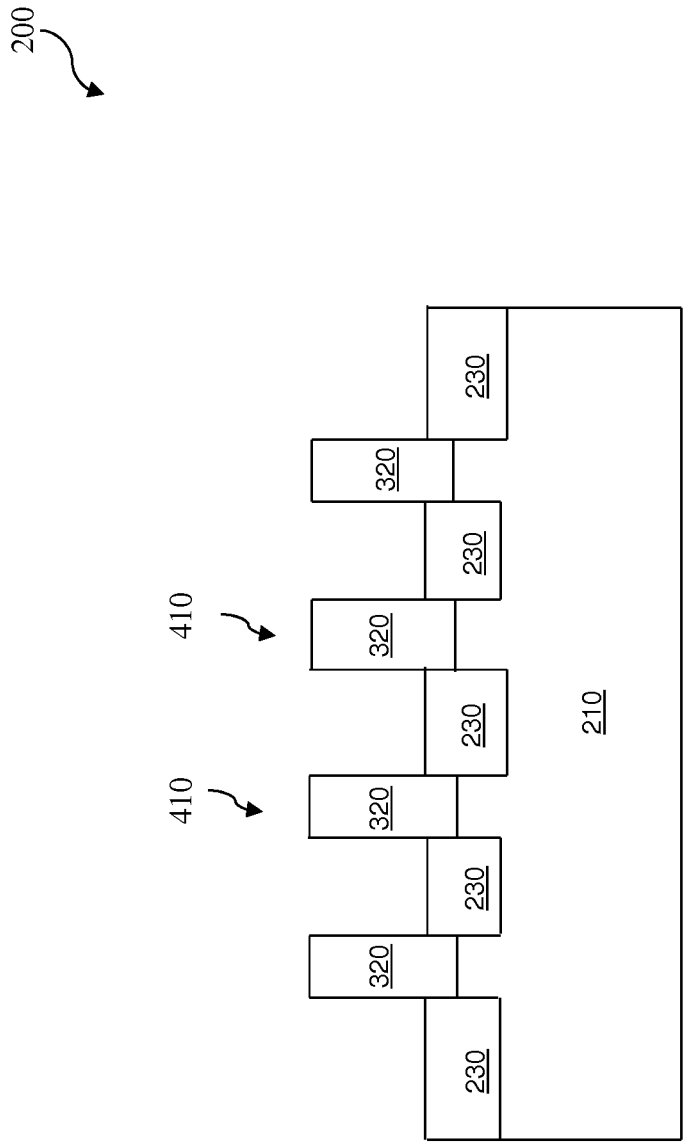
Figure 7:
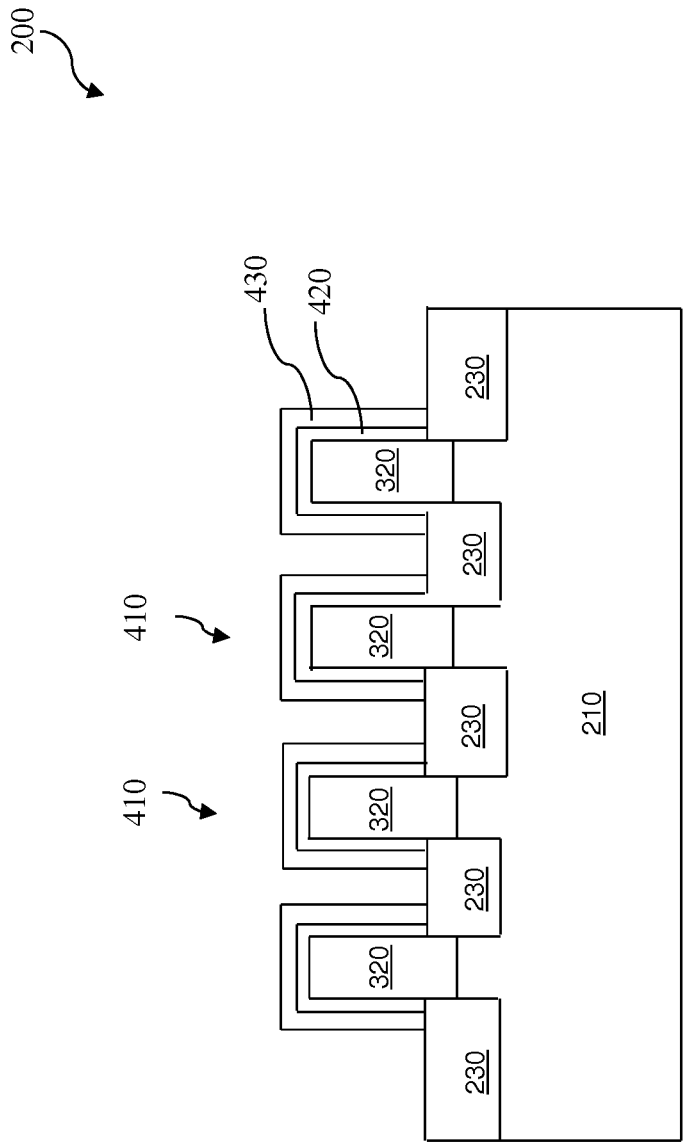

The method 100 proceeds to step 110 by recessing the isolation regions 230 around the semiconductor material layer 320 to expose an upper portion of the semiconductor material layer 320, thereby forming second fins 410, as shown in FIG. 6. The recessing process may include dry etching process, wet etching process, and/or combination thereof. In the present embodiment, the second fin 410 is a SiGe fin.

The method 100 proceeds to step 112 by performing a thermal anneal on the second fins 410 of the FinFET device 200 in oxygen ambient with a second temperature. The second temperature of the annealing process is higher than the first temperature of the epitaxially growing process of the semiconductor layer 320. The annealing process may be a rapid thermal anneal (RTA), a laser anneal, and/or a flash lamp anneal. In the present embodiment, the annealing process is conducted in oxygen ambient with a second temperature ranging from about 700° C. to about 1300° C. Alternatively, the annealing process may be conducted in a combination of steam ambient and oxygen ambient, or under an inert gas atmosphere. The annealing process includes an annealing duration ranging between about 5 seconds and about 600 seconds. As an example, the second temperature is about 900° C. and the duration is about 60 seconds. In another embodiment, the annealing process may include a pre-heat range from about 200° C. to about 700° C., and include other appropriate temperatures and ranges. The pre-heat may be performed for about 50 to about 300 seconds Referring to FIG. 7, in the present embodiment, the thermal annealing process in oxygen ambient results in forming a conformal $Si_{1-y}Ge_y$ interface 420 and a $SiO_2$ interface 430 such that the $Si_{1-y}Ge_y$ interface 420 is formed (or wrapped over) on the surface of the second fin 410, the $Si_{1-x}Ge_x$ fin, and the $SiO_2$ interface 430 is formed on the $Si_{1-y}Ge_y$ interface 420. The $Si_{1-y}Ge_y$ interface 420 exhibits substantially conformability. In order to characterize layers 320 and 420, such as film density and composition, a metrology of characterization is conducted by using suitable techniques, such as Fourier Transform Infrared (FTIR) spectroscopy, electron energy loss spectroscopy in scanning tunneling electron microscope (EELS-STEM), ultrasonic force microscopy (UFM), x-ray photoelectron spectroscopy (XPS) or electron spin resonance spectroscopy (ESR). By comparing Ge concentration in the $Si_{1-x}Ge_x$ fin 320 and the $Si_{1-y}Ge_y$ interface 420, a characterization shows Ge composition y of the $Si_{1-y}Ge_y$ interface 420 is substantially higher than the Ge composition x of the $Si_{1-x}Ge_x$ fin 320 (y>>x), referring the $Si_{1-y}Ge_y$ interface 420 to as a Ge richer SiGe interface. For example, a ratio of y to x is 1.3.

The thickness of the $Si_{1-y}Ge_y$ interface 420 may be controlled by the thermal annealing conditions, such as annealing temperature and annealing time.

Figure 8:
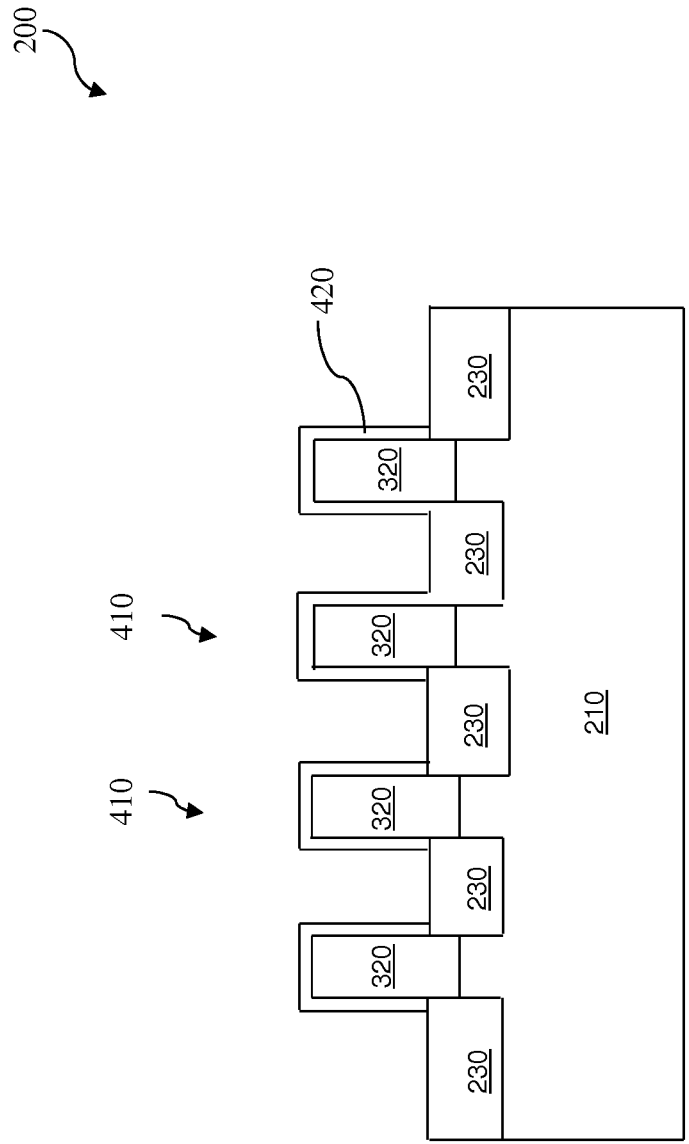

Referring to FIG. 8, in the present embodiment, the method 100 may further include removing the $SiO_2$ interface 430 by a selective etching process. Thus the second fin 420, $Si_{1-x}Ge_x$ fin, is configured to have a conformal Ge richer interface 430 wrapping around its surface. The $Si_{1-x}Ge_x$ fin with a Ge rich interface wrapping around it may be used as a portion of a quantum-well (QW) channel in a FinFET device, a portion of a gate structure in a FinFET device, or any other appropriate structures.

Figure 9:
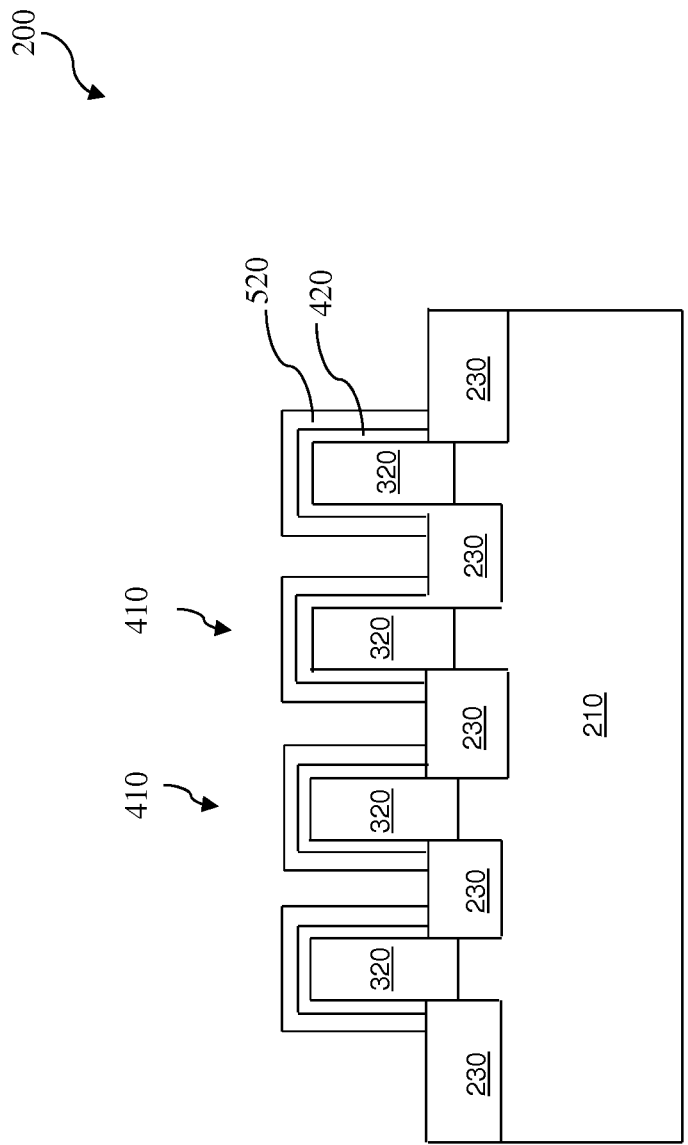

Referring to FIG. 9, in another embodiment, a capping layer 520 is formed over the $Si_{1-y}Ge_y$ interface to cooperate with the formation of a high-k (HK) dielectric and metal gate (MG) in subsequent processes. For example, HK/MG gate stacks are formed over the substrate 210, including over (wrapping) a portion of the second fins 410 with the Si capping layer 520. The HK/MG gate stack may include a dielectric layer, a gate electrode layer and a hard mask layer. The dielectric layer may include an interfacial layer (IL) and a HK dielectric layer. Examples of high-k dielectric material includes HfO2, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode layers are formed over the dielectric layer by any suitable process. The gate electrode layers may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The HK/MG gate stack may be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof.

The FinFET device 200 may undergo further CMOS or MOS technology processing to form various features and regions known in the art. For example, further fabrication processes may include, among other things, forming source and drain (S/D) regions on each side of the gate structure. S/D regions may be formed by recess, epitaxial growth, and implant techniques. Additional steps can be provided before, during, and after the method 100, and some of the steps described can be replaced or eliminated for other embodiments of the method.

Subsequent processing may also form various contacts/vias/lines and multilayers interconnect features (e.g., metal layers and interlayer dielectrics) on the semiconductor substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers methods for fabricating a FinFET device. The method employs performing the thermal annealing in an oxygen ambient on the fin, grown by an epitaxially process, to form a conformal and a different composition interface wrapping the fin.

The present disclosure provides many different embodiments of fabricating a FinFET device that provide one or more improvements over the prior art. In one embodiment, a method for fabricating a FinFET device includes providing a substrate having a first fin on it. The method also includes forming a second fin with a first temperature on the substrate. A thermal annealing with a second temperature in an oxygen ambient is performed on the substrate with the second fin thereon to grow an interface wrapping over the second fin. The second temperature is higher than the first temperature.

In another embodiment, a method for fabricating a FinFET device includes providing a substrate. The method also includes recessing the substrate to form a first fin, forming isolation regions between first fins on the substrate, recessing the first fin to form recessing trenches, epitaxially growing silicon germanium (SiGe) layer with a first temperature on the recessed first fin and filling in the recessing trenches, recessing the isolation regions to expose an upper portion of the SiGe layer to form a SiGe fin and performing a thermal annealing with a second temperature in an oxygen ambient to the SiGe fin to form a SiGe interface with a substantial different Ge concentration wrapping over the SiGe fin.

In yet another embodiment, a method for fabricating a FinFET device includes providing a silicon (Si) substrate. The method also includes etching back a portion of the Si substrate to form Si fins, forming isolation regions between the Si fins, recessing the Si fins to form recessing trenches on the Si substrate, wherein having the isolation regions as sidewalls of the recessing trenches. The method also includes epitaixially growing a silicon germanium (SiGe) layer with a first temperature on the recessed Si fins to fill in the recessing trenches, recessing the isolation regions to expose an upper portion of the SiGe layer, wherein the upper portion of the SiGe layer forms a SiGe fin. The method further includes performing a thermal annealing in oxygen ambient on the SiGe fin by using a second temperature which is higher than the first temperature, wherein a conformal SiGe interface is formed such that it wraps over the SiGe fin with a substantial higher Ge concentration; wherein a $SiO_2$ interface is formed over the SiGe interface. The method yet further includes removing the $SiO_2$ interface by an etching process and forming a Si capping layer on the SiGe interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field-effect transistor (FinFET) device, the method comprising:

providing a substrate having a first fin at a first location;

epitaxially growing a second fin on the substrate at the first location, the epitaxially growth being performed at a first temperature; and performing a thermal annealing at a second temperature in an oxygen ambient on the substrate with the second fin thereon, to grow an interface wrapping over the second fin, wherein the second temperature is higher than the first temperature.

2. The method of claim 1, wherein the interface has a substantially different composition than the epitaxially grown second fin.

3. The method of claim 1, wherein a thickness of the interface is controlled by the second temperature.

4. The method of claim 1, wherein the second fin includes a silicon germanium (SiGe) fin.

5. The method of claim 4, wherein the SiGe fin is formed by:

forming isolation regions on sides of the first fin;

recessing the first fin to form a recessing trench in the isolation regions;

epitaxially growing a SiGe layer with the first temperature on the recessed first fin to at least partially fill the recessing trench; and recessing the isolation regions to laterally expose at least a portion of the epitaxially grown SiGe layer to form the SiGe fin.

6. The method of claim 1, wherein the second temperature is in a range from about 700° C. to about 1500° C.

7. The method of claim 5, wherein after the annealing process, the interface wrapping over the SiGe fin includes SiGe with a substantial different Ge concentration than the SiGe fin.

8. The method of claim 7, wherein the Ge concentration in the SiGe interface is substantially higher than that of the SiGe fin.

9. The method of claim 7, wherein the SiGe interface conformably wraps the SiGe fin.

10. The method of claim 1, wherein a $SiO_2$ interface is formed on the SiGe interface during the thermal annealing process.

11. The method of claim 10, further comprising:

removing the $SiO_2$ interface by an etching process.

12. A method for fabricating a fin field-effect transistor (FinFET) device, the method comprising:

providing a substrate;

recessing the substrate to form a plurality of first fins;

forming isolation regions between the first fins on the substrate;

recessing the first fins to form at least one recessing trench in the isolation regions;

epitaxially growing silicon germanium (SiGe) layer with a first temperature in the recessing trench;

recessing the isolation regions to expose an upper portion of the SiGe layer to form a SiGe fin; and performing a thermal anneal at a second temperature in an oxygen ambient to the SiGe fin to form a SiGe interface with a substantial different Ge concentration than the SiGe fin.

13. The method of claim 12, wherein the second temperature is higher than the first temperature.

14. The method of claim 13, wherein the second temperature is in a range from about 700° C. to about 1500° C.

15. The method of claim 12, wherein a Ge concentration in the SiGe interface is substantially higher than the one in the SiGe fin.

16. The method of claim 12, wherein a thickness of the SiGe interface is adjustable by adjusting the annealing condition including the second temperature and a duration of the anneal.

17. The method of claim 12, wherein the SiGe interface is formed to conformably wrap over the SiGe fin.

18. The method of claim 12, wherein a $SiO_2$ interface is formed on the SiGe interface during the annealing.

19. The method of claim 18, further comprising:

removing the $SiO_2$ interface; and then depositing a Si capping layer on the SiGe interface.

20. A method for fabricating a fin field-effect transistor (FinFET) device, the method comprising:

providing a silicon (Si) substrate;

etching back a portion of the Si substrate to form a plurality of Si fins;

forming isolation regions between the Si fins;

recessing the Si fins to form recessing trenches on the Si substrate;

epitaixially growing a silicon germanium (SiGe) layer with a first temperature in the recessing trenches;

recessing the isolation regions to expose an upper portion of the SiGe layer, wherein the upper portion of the SiGe layer forms a plurality of SiGe fins;

performing a thermal annealing in an oxygen ambient on the SiGe fins by using a second temperature which is higher than the first temperature, wherein a conformal SiGe interface is formed that wraps over the SiGe fins, wherein the SiGe interface has a substantial higher Ge concentration than the SiGe fins, and wherein a $SiO_2$ interface is formed over the SiGe interface;

removing the $SiO_2$ interface by an etching process; and after removing the $SiO_2$ interface, forming a Si capping layer on the SiGe interface.

* * * * *